(12) United States Patent
Yang et al.

(10) Patent No.: US 12,513,879 B2
(45) Date of Patent: Dec. 30, 2025

(54) METHOD OF MANUFACTURING CAPACITOR, CAPACITOR, AND MEMORY

(71) Applicants: CHANGXIN MEMORY TECHNOLOGIES, INC., Hefei (CN); CHANGXIN JIDIAN (BEIJING) MEMORY TECHNOLOGIES CO., LTD., Beijing (CN)

(72) Inventors: Mengmeng Yang, Hefei (CN); Deyuan Xiao, Hefei (CN)

(73) Assignees: CHANGXIN MEMORY TECHNOLOGIES, INC., Hefei (CN); CHANGXIN JIDIAN (BEIJING) MEMORY TECHNOLOGIES CO., LTD., Beijing (CN)

( * ) Notice: Subject to any disclaimer, the term of this patent is extended or adjusted under 35 U.S.C. 154(b) by 691 days.

(21) Appl. No.: 17/822,815

(22) Filed: Aug. 29, 2022

(65) Prior Publication Data

US 2023/0354574 A1   Nov. 2, 2023

Related U.S. Application Data

(63) Continuation of application No. PCT/CN2022/098120, filed on Jun. 10, 2022.

(30) Foreign Application Priority Data

Apr. 29, 2022 (CN) .......................... 202210462602.3

(51) Int. Cl.
*H01L 27/108* (2006.01)
*H10B 12/00* (2023.01)

(52) U.S. Cl.
CPC ............. *H10B 12/03* (2023.02); *H10B 12/30* (2023.02)

(58) Field of Classification Search
CPC ........ H10B 12/03; H10B 12/30; H10B 12/05; H10D 30/43; H10D 62/121; H10D 1/692;
(Continued)

(56) References Cited

U.S. PATENT DOCUMENTS

| | | | |
|---|---|---|---|
| 7,906,803 B2 | 3/2011 | Shioya et al. | |
| 10,861,854 B2 | 12/2020 | Kim et al. | |

(Continued)

FOREIGN PATENT DOCUMENTS

| | | | |
|---|---|---|---|
| CN | 1979705 A | 6/2007 | |
| CN | 102607394 A | 7/2012 | |

(Continued)

OTHER PUBLICATIONS

International Search Report cited in PCT/CN2022/098120 mailed Jan. 17, 2023, 10 pages.

(Continued)

*Primary Examiner* — Mohammed R Alam
(74) *Attorney, Agent, or Firm* — Kilpatrick Townsend & Stockton LLP

(57) ABSTRACT

The present disclosure provides a method of manufacturing a capacitor, a capacitor, and a memory, and relates to the technical field of semiconductors. The method of manufacturing a capacitor includes: providing a substrate; forming a first electrode on the substrate, the first electrode extending in a first direction parallel to the substrate, a size of the first electrode in the first direction being greater than a size of the first electrode in a second direction and a size of the first electrode in a third direction, and every two of the first direction, the second direction, and the third direction being perpendicular to each other; forming a dielectric layer wrapping the first electrode; and forming a second electrode wrapping the dielectric layer.

11 Claims, 9 Drawing Sheets

(58) Field of Classification Search
CPC .......... H10D 30/6735; H10D 30/6757; H10D 84/813; B82Y 10/00
See application file for complete search history.

(56) References Cited

U.S. PATENT DOCUMENTS

| | | | |
|---|---|---|---|
| 2007/0126079 A1 | 6/2007 | Shioya et al. | |
| 2022/0005809 A1 | 1/2022 | Kim et al. | |
| 2023/0048424 A1* | 2/2023 | Kim | H10D 30/6757 |
| 2023/0081882 A1* | 3/2023 | Ma | H10B 12/05 |
| | | | 257/296 |

FOREIGN PATENT DOCUMENTS

| | | | |
|---|---|---|---|
| CN | 105206421 A | 12/2015 | |
| CN | 108447864 A | 8/2018 | |
| CN | 109616474 A | 4/2019 | |
| CN | 113889473 A | 1/2022 | |
| CN | 114582809 A | 6/2022 | |
| JP | 2007184554 A | 7/2007 | |
| JP | 2013168570 A | 8/2013 | |
| KR | 20190038225 A | 4/2019 | |
| WO | 2021204047 A1 | 10/2021 | |

OTHER PUBLICATIONS

First Office Action cited in CN202210462602.3, mailed Jun. 14, 2022, 17 pages.
European Search Report cited in EP22782648.4 mailed Dec. 21, 2023, 8 pages.

* cited by examiner

METHOD OF MANUFACTURING CAPACITOR, CAPACITOR, AND MEMORY

CROSS-REFERENCE TO RELATED APPLICATIONS

This is a continuation of International Application No. PCT/CN2022/098120, filed on Jun. 10, 2022, which claims the priority to Chinese Patent Application No. 202210462602.3, titled "METHOD OF MANUFACTURING CAPACITOR, CAPACITOR, AND MEMORY" and filed on Apr. 29, 2022. The entire contents of International Application No. PCT/CN2022/098120 and Chinese Patent Application No. 202210462602.3 are incorporated herein by reference.

TECHNICAL FIELD

The present disclosure relates to a method of manufacturing a capacitor, a capacitor, and a memory.

BACKGROUND

As a commonly used semiconductor memory device in computers, a dynamic random access memory (DRAM) includes many repeated memory cells. Each memory cell usually includes a capacitor and a transistor. With the development of semiconductor technologies, sizes of semiconductor devices are getting smaller and smaller, and requirements for semiconductor manufacturing technologies are also increasing.

However, a storage density of the existing memory has encountered a bottleneck in horizontal expansion. Therefore, how to improve the storage density and performance of the memory is a technical problem that needs to be solved urgently.

SUMMARY

An overview of the subject matter described in detail in the present disclosure is provided below, which is not intended to limit the protection scope of the claims.

The present disclosure provides a method of manufacturing a capacitor, a capacitor, and a memory.

A first aspect of the present disclosure provides a method of manufacturing a capacitor, including:
  providing a substrate;
  forming a first electrode on the substrate, the first electrode extending in a first direction parallel to the substrate, a size of the first electrode in the first direction being greater than a size of the first electrode in a second direction and a size of the first electrode in a third direction, and every two of the first direction, the second direction, and the third direction being perpendicular to each other;
  forming a dielectric layer wrapping the first electrode; and
  forming a second electrode wrapping the dielectric layer.

A second aspect of the present disclosure provides a capacitor, including:
  a substrate;
  a first electrode, located on the substrate and extending in a first direction parallel to the substrate, a size of the first electrode in the first direction being greater than a size of the first electrode in a second direction and a size of the first electrode in a third direction, and every two of the first direction, the second direction, and the third direction being perpendicular to each other;
  a dielectric layer, wrapping a surface of the first electrode; and
  a second electrode, wrapping a surface of the dielectric layer.

A third aspect of the present disclosure provides a memory, including:
  the capacitor according to the above second aspect; and
  a gate-all-around transistor, a gate of the gate-all-around transistor being connected to a word line, one of a drain and a source of the gate-all-around transistor being connected to a bit line, and the other one of the drain and the source of the gate-all-around transistor being connected to the capacitor, wherein the capacitor extends in a first direction, the word line extends in a second direction, and the bit line extends in a third direction.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

REFERENCE NUMERALS

10. Substrate;
20. First electrode;
30. Dielectric layer;
40. Second electrode;
50. Epitaxial layer;
51. Monocrystalline layer;
52. Silicon-containing material layer;
60. Pattern region;
61. Groove;
70. Contact region;
80. Gap;
90. First mask layer;
100. First mask pattern;
110. First electrode material;
120. Support structure;
130. Support material;
140. Second mask layer;
141. Second mask pattern;
142. Mask pillar;
150. Gate-all-around transistor;
151. Word line;
152. Bit line;
160. External circuit;
161. Contact layer;
162. Conductive layer;
170. Array opening;
180. Isolation material;
190. Buffer region;
10A. Capacitor;
10B. Active region;
S. Source;
D. drain.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

An exemplary embodiment of the present disclosure provides a method of manufacturing a semiconductor structure, the first electrode is arranged in the first direction parallel to the substrate, and the size of the first electrode in the transverse direction is greater than that in the longitudinal direction, such that the first electrode, the dielectric layer, and the second electrode form a horizontally arranged capacitor, more capacitors may be arranged in the three-dimensional space, and the storage capacity of the memory is increased. In addition, the capacitor structure provided by the present disclosure may be adapted to the gate-all-around transistor, which greatly expands the integration space of the memory. The method of manufacturing a semiconductor structure is described below with reference to FIG. 1 to FIG. 30.

A semiconductor structure is not limited in this embodiment. The semiconductor structure is described below by using a capacitor in a dynamic random access memory (DRAM) as an example, but this embodiment is not limited thereto. Alternatively, the semiconductor structure in this embodiment may further be another structure.

Figure 1:
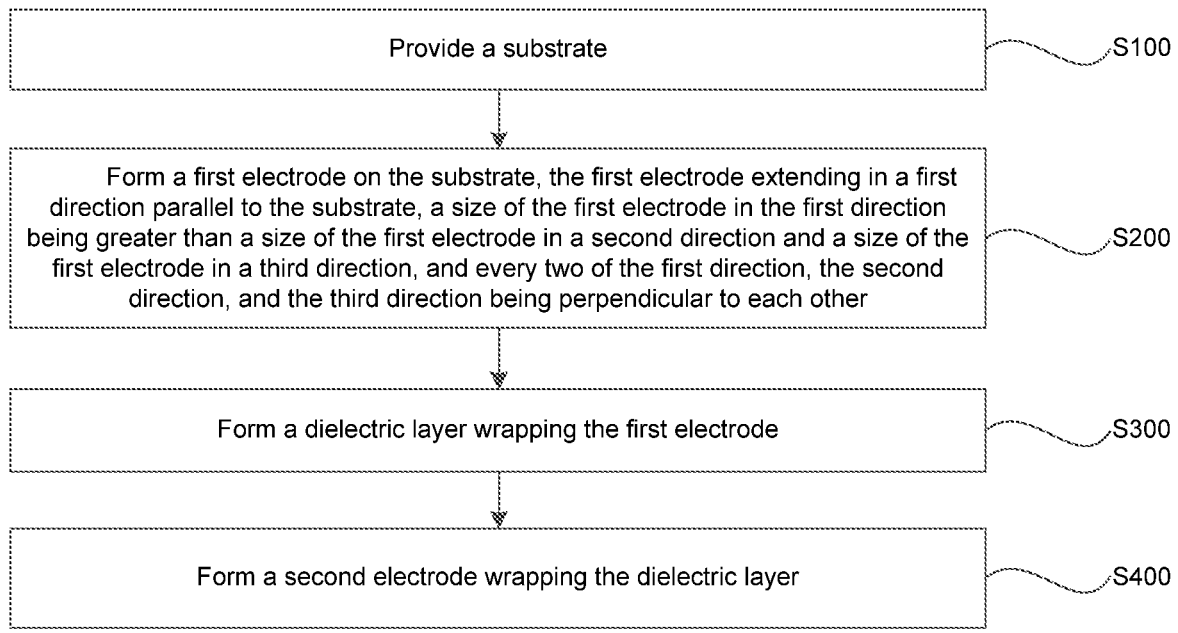
FIG. 1 is a flowchart of a method of manufacturing a capacitor according to one exemplary embodiment.

As shown in FIG. 1, one exemplary embodiment of the present disclosure provides a method of manufacturing a capacitor, including:

Step S100: provide a substrate.

Step S200: form a first electrode on the substrate, the first electrode extending in a first direction parallel to the substrate, a size of the first electrode in the first direction being greater than a size of the first electrode in a second direction and a size of the first electrode in a third direction, and every two of the first direction, the second direction, and the third direction being perpendicular to each other.

Step S300: form a dielectric layer wrapping the first electrode.

Step S400: form a second electrode wrapping the dielectric layer.

In step S100, the substrate 10 is used as a support component of the DRAM to support other components provided thereon. For example, the substrate 10 may be provided with structures such as a word line structure, a bit line structure, an isolation structure, and an active region. The substrate 10 may be made of a semiconductor material. The semiconductor material may be one or more of silicon, germanium, a silicon-germanium compound, or a silicon-carbon compound.

Figure 2:
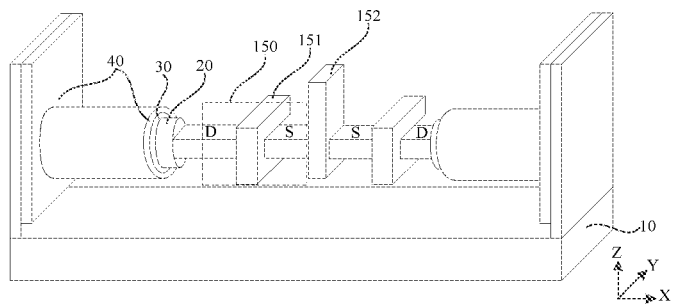
FIG. 2 is a schematic diagram of horizontal placement of a single-layer capacitor according to one exemplary embodiment.

In step S200, by taking the direction shown in FIG. 2 as an example, a direction parallel to a top surface of the substrate 10 is defined as a first direction X, and the first direction X may be a length direction of a first electrode 20. A direction parallel to the top surface of the substrate 10 and perpendicular to the first direction X as a second direction Y, the second direction Y may be a width direction of a first electrode 20, and the second direction may also be parallel to the top surface of the substrate 10. An extension direction perpendicular to the top surface of the substrate 10 is defined as a third direction Z (the third direction Z may be a vertical direction), and the third direction Z may be a thickness direction of a first electrode 20.

Referring to FIG. 2, in step S200, the first electrode 20 may be formed on the substrate 10 by using a deposition process. A material of the first electrode 20 may include, but is not limited to, polysilicon, metal tungsten, or titanium nitride, etc. The first electrode 20 extends in the first direction X parallel to the substrate 10, which can define a capacitor length in a single capacitor. A size of the first electrode 20 in the first direction X is greater than a size of the first electrode 20 in the second direction Y, and the first direction X is perpendicular to the second direction Y. The size of the first electrode 20 in the first direction X is also greater than a size of the first electrode 20 in the third direction Z. That is, the first electrode 20 has a high aspect ratio, for example, may be greater than or equal to 35, and furthermore, for example, 35-220, for example, 36:1 or 80:1 or 100:1 or 150:1 or 200:1. When the aspect ratio of the first electrode 20 is less than 35, the length of the first electrode 20 of the capacitor 10A is relatively small, and the storage capacity of the capacitor is insufficient. When the aspect ratio of the first electrode is too high, for example, greater than 220, the capacitor 10A has high manufacturing difficulty and unstable performance. Using a parameter value in the above range may increase the storage capacity of the capacitor 10A and ensure stable and reliable performance of the capacitor 10A. The first direction X is perpendicular to the third direction Z, and meanwhile, the second direction Y is also perpendicular to the third direction Z.

In step S300, a material of the dielectric layer 30 may include, but is not limited to, a high-K material. The high-K material may be, for example, one of zirconium oxide (ZrOx), hafnium oxide (HfOx), titanium zirconium oxide (ZrTiOx), ruthenium oxide (RuOx), aluminum oxide (AlOx), or a combination thereof. That is to say, the material of the dielectric layer may be one of the above materials, or may also be a combination or a mixture of the above materials. In one example, the material of the dielectric layer 30 is the high-K material, facilitating increasing a capacitance value of the subsequent capacitor per unit area, increasing the charge storage capacity of the subsequently formed capacitor, and improving the performance of a semiconductor structure.

In step S400, by taking FIG. 2 as an example, a portion of a second electrode 40 wraps an outer surface of a dielectric layer 30 in the first direction X, and a remaining portion of the second electrode 40 is arranged in the third direction Z. A material of the second electrode 40 may include, but is not limited to, polysilicon, metal tungsten, or titanium nitride, etc.

It should be noted that the deposition process in this embodiment and the following may include, but is not limited to, an atomic layer deposition process, a physical vapor deposition process, or a chemical vapor deposition process.

In this embodiment, a length size of the first electrode is greater than a width size and a thickness size of the first electrode to form a horizontally placed first electrode, which matches the dielectric layer and the second electrode to form a horizontally placed capacitor. Thus, more capacitors may be arranged in a three-dimensional (3D) space, thereby increasing the storage capacity of the memory.

Figure 4:
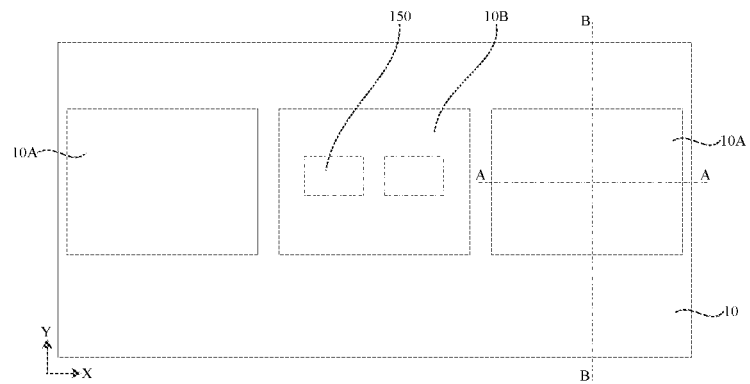
FIG. 4 is a top view of FIG. 2.

Referring to FIG. 2 and FIG. 4, when the capacitor 10A is horizontally placed, two capacitors 10A located on a same horizontal line are oppositely arranged, and are respectively connected to sources S or drains D of two oppositely arranged gate-all-around (GAA) transistors 150. The two GAA transistors 150 share a same bit line 152 and are located on a same horizontal line, such that the integration level of memory per unit area can be further increased. It should be noted that in FIG. 4, the two oppositely arranged GAA transistors 150 are arranged in an active region 10B, where the active region 10B is located between the two horizontally arranged capacitors 10A.

Figure 3:
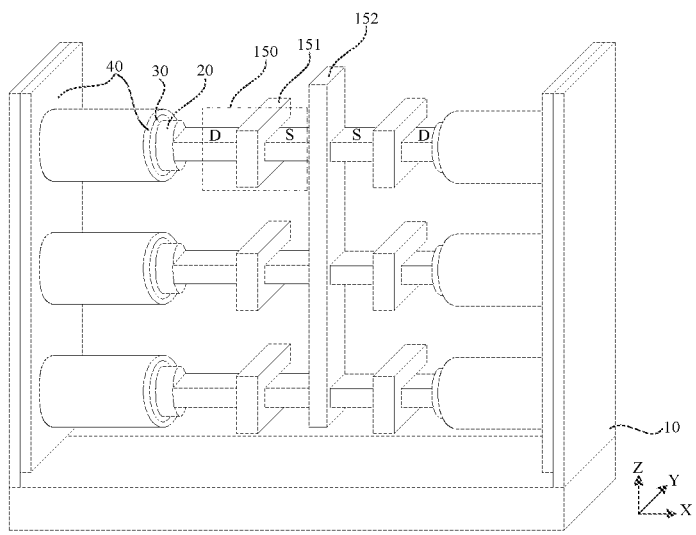
FIG. 3 is a schematic diagram of vertical arrangement of a multi-layer capacitor according to one exemplary embodiment.

According to one exemplary embodiment, as shown in FIG. 3, this embodiment includes the method in the above embodiment. Details are not described herein again. The difference from the above embodiment is that the process of forming the first electrode 20 on the substrate 10 includes:

forming a plurality of first electrodes 20 arranged at intervals in the second direction Y and/or in the third direction Z, a 3D space being formed between adjacent two of the first electrodes 20. The dielectric layer 30 formed in step S300 of the above embodiment wraps surfaces of the plurality of first electrodes 20 and is located in the 3D spaces, and forms a common dielectric layer 30. The second electrode 40 formed in step S400 of the above embodiment wraps a surface of the dielectric layer 30 and is located in the 3D spaces, and forms a common second electrode 40.

That is to say, the plurality of first electrodes 20 may be arranged in a rectangular array to form a 3D structure. Both the dielectric layer 30 and the second electrode 40 in the 3D structure are commonly used, and one dielectric layer 30 and one second electrode 40 are provided. That is, the plurality of first electrodes 20 arranged in an array are connected through one dielectric layer 30, the second electrode 40 wraps the outer surface of the dielectric layer 30, and the second electrode 40 is as a whole. By taking FIG. 3 as an example, a portion of the second electrode 40 wraps the outer surface of the dielectric layer 30 in the first direction X, and the remaining portion of the second electrode 40 is arranged in the third direction Z. Thus, the manufacturing process difficulty and process costs of the capacitor are reduced.

In this embodiment, the plurality of first electrodes are arranged in a rectangular array in a length direction, and share one dielectric layer and one second electrode, thereby forming a capacitor of a 3D structure. The capacitor of the 3D structure may be expanded in a width direction and thickness direction thereof, such that more horizontally placed capacitors are arranged in a storage space per unit area, thereby effectively increasing the integration level and storage capacity of the memory.

Figure 5:
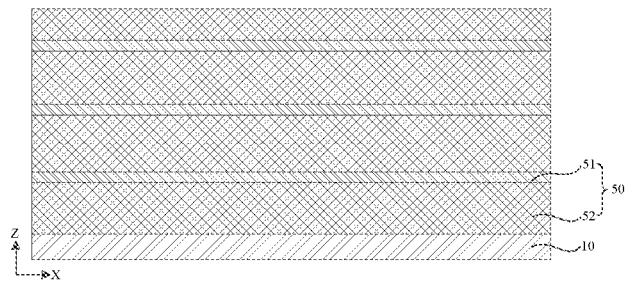
FIG. 5 is a sectional view of an A-A cross section of an epitaxial layer in FIG. 4 that is formed in a method of manufacturing a capacitor according to one exemplary embodiment.
Figure 6:
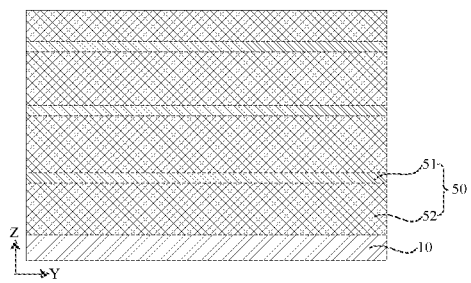
FIG. 6 is a sectional view of a B-B cross section of an epitaxial layer in FIG. 4 that is formed in a method of manufacturing a capacitor according to one exemplary embodiment.

According to one exemplary embodiment, as shown in FIG. 5 and FIG. 6, this embodiment is a further description of step S200 described above.

At least one layer of an epitaxial layer 50 is formed on the substrate 10 by using a deposition process. The epitaxial layer 50 includes a monocrystalline layer 51 and a silicon-containing material layer 52 alternately arranged, where a size of the monocrystalline layer 51 in the first direction X is greater than a size of the monocrystalline layer 51 in the second direction Y and a size of the monocrystalline layer 51 in the third direction Z. A material of the silicon-containing material layer 52 may include, but is not limited to, silicon germanium (SiGe), which has etching selectivity with the monocrystalline layer 51. There may be one epitaxial layer 50, or may also be multiple epitaxial layers, such as two layers, three layers, or four layers.

In one example, when there is one epitaxial layer 50, a horizontally placed capacitor 10A may be formed, or a plurality of capacitors 10A arranged at intervals in the second direction Y may be formed. The plurality of capacitors horizontally arranged in the second direction Y share one dielectric layer 30 and one second electrode 40. That is, a capacitor 10A of a two-dimensional structure arranged in the second direction Y may be formed.

In another example, when there are multiple epitaxial layers 50, a horizontally placed capacitor of a 3D structure can be formed. At this time, multiple layers of first electrodes 20 arranged at intervals may be arranged in the third direction Z, thereby effectively increasing the storage capacity and integration level of the capacity per unit area.

After the epitaxial layer 50 is formed, referring to FIG. 7 to FIG. 11, a pattern region 60 and a contact region 70 are defined on the epitaxial layer 50. A portion of the monocrystalline layer 51 in the contact region 70 may be configured to form a source region or a drain region of a transistor, so as to perform doping treatment on the source region or the drain region to form a source S or a drain D of the transistor. Of course, in some processes, the source S and the drain D may be formed first; or, the source S and the drain D may be also formed when the capacitor 10A is manufactured.

Figure 11:
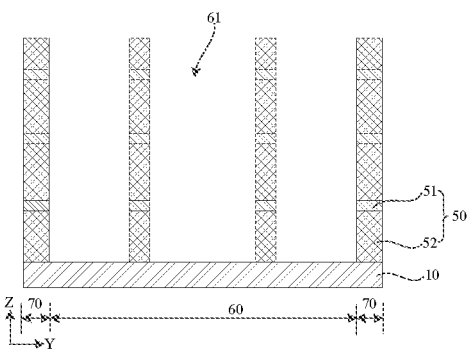
FIG. 11 is a sectional view of a B-B cross section of a groove in FIG. 4 that is formed in a method of manufacturing a capacitor according to one exemplary embodiment.

Referring to FIG. 11, the epitaxial layer 50 is selectively etched downwards in the pattern region 60 until the top surface of the substrate 10 is exposed. The remaining portion of the epitaxial layer 50 that is not etched in the pattern region 60 defines a position of the first electrode 20, and the remaining portion of the epitaxial layer 50 in the pattern region 60 extends in a transverse direction, namely the first direction X. In this step, in the remaining portion of the epitaxial layer 50 that is not etched in the pattern region 60, a position where the monocrystalline layer 51 is located in the remaining portion of the epitaxial layer 50 is a reversed position of the first electrode 20. That is, after the monocrystalline layer 51 between adjacent two of the silicon-containing material layers 52 in the remaining portion of the epitaxial layer 50 in a vertical direction in the pattern region 60 is removed, the original position of the monocrystalline layer 51 is configured to form the first electrode 20.

Figure 12:
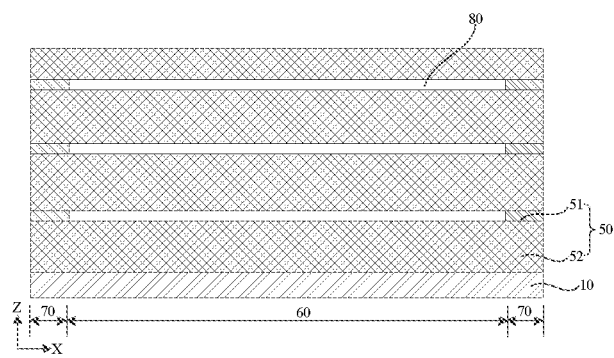
FIG. 12 is a sectional view of an A-A cross section of a gap in FIG. 4 that is formed in a method of manufacturing a capacitor according to one exemplary embodiment.
Figure 13:
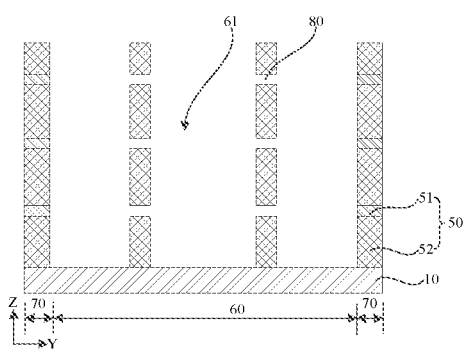
FIG. 13 is a sectional view of a B-B cross section of a gap in FIG. 4 that is formed in a method of manufacturing a capacitor according to one exemplary embodiment.

Referring to FIG. 12 and FIG. 13, the remaining portion of the monocrystalline layer 51 in the remaining portion of the epitaxial layer 50 is removed by using an etching process and a gap 80 is formed. Subsequently, the first electrode 20 is formed in the gap 80 by using a deposition process.

Figure 16:
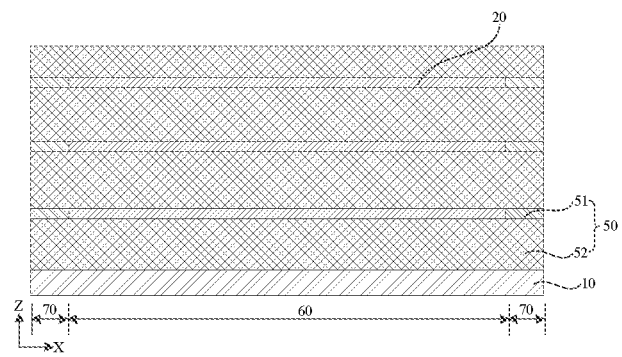
FIG. 16 is a sectional view of an A-A cross section of a first electrode in FIG. 4 that is formed in a method of manufacturing a capacitor according to one exemplary embodiment.
Figure 17:
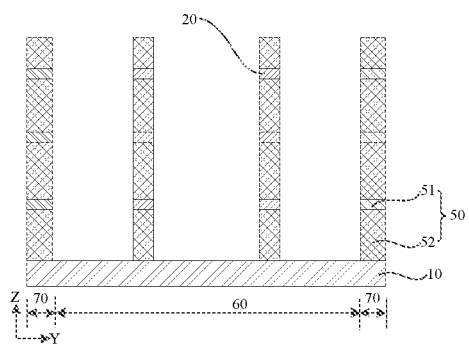
FIG. 17 is a sectional view of a B-B cross section of a first electrode in FIG. 4 that is formed in a method of manufacturing a capacitor according to one exemplary embodiment.

Referring to FIG. 16 and FIG. 17, in one embodiment, the number of columns of capacitors is defined in the third direction Z, for example, in the third direction Z, three epitaxial layers 50 are arranged on the substrate. That is, a three-layer space for placing the capacitor 10A is formed in the third direction Z. Etching is selectively performed in the second direction Y, and the number of rows of capacitors is defined in the second direction Y, for example, two remaining epitaxial layers 50 arranged side by side in the pattern region 60 after etching are arranged at intervals in the second direction Y. That is, a two-layer space for placing the capacitor 10A is formed in the second direction Y. That is to say, at this time, in FIG. 16 and FIG. 17, six first electrodes 20 arranged in an array may be formed.

In this embodiment, a forming position of the first electrode is defined by using the remaining portion of the epitaxial layer in the pattern region, and a portion of the monocrystalline layer between any adjacent two of the silicon-containing material layers in the contact region is configured to form the source region or the drain region of the transistor. Thus, the first electrode is connected to the source or the drain of the transistor in the process of forming the first electrode.

Figure 7:
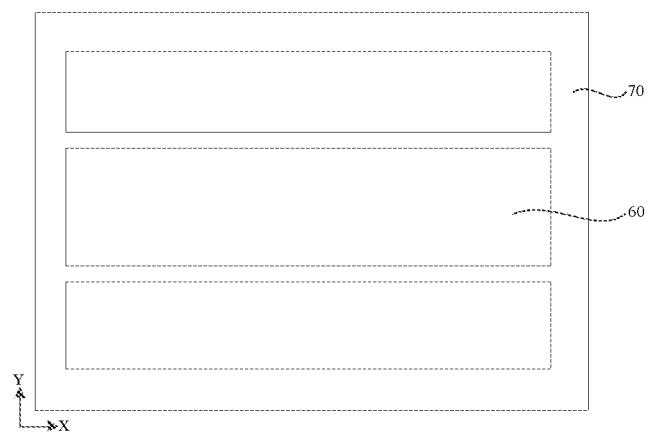
FIG. 7 is a top view of a first mask pattern formed in a method of manufacturing a capacitor according to one exemplary embodiment.
Figure 8:
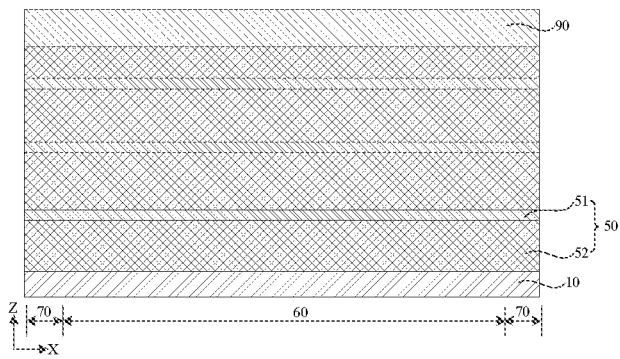
FIG. 8 is a sectional view of an A-A cross section of a first mask layer in FIG. 4 that is formed in a method of manufacturing a capacitor according to one exemplary embodiment.
Figure 9:
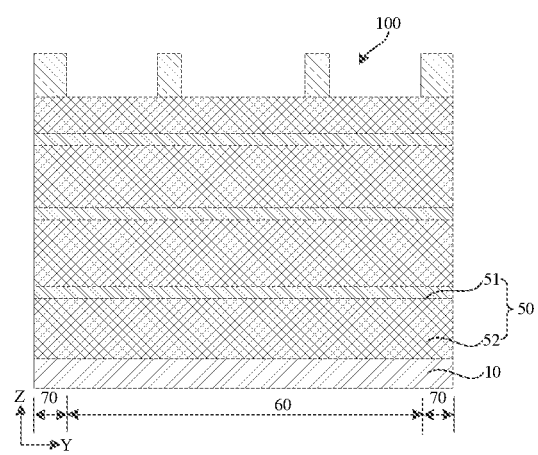
FIG. 9 is a sectional view of a B-B cross section of a first mask pattern in FIG. 4 that is formed in a method of manufacturing a capacitor according to one exemplary embodiment.
Figure 10:
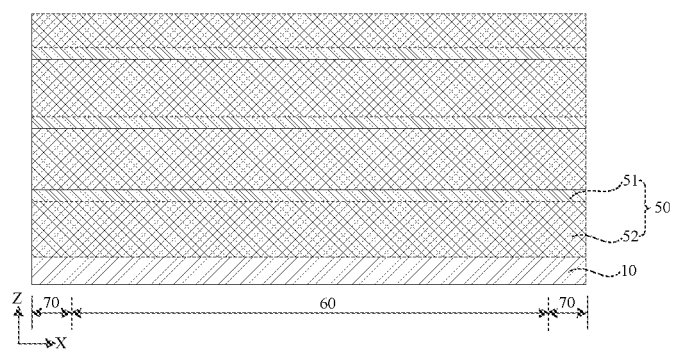
FIG. 10 is a sectional view of an A-A cross section of a groove in FIG. 4 that is formed in a method of manufacturing a capacitor according to one exemplary embodiment.

In some embodiments, referring to FIG. 7 to FIG. 9, the pattern region 60 and the contact region 70 may be formed by using the following method:

Still referring to FIG. 8 and FIG. 9, a first mask layer 90 is formed on the top surface of the epitaxial layer 50 by using a deposition process. The first mask layer 90 is patterned to form a first mask pattern 100 on the first mask layer 90. By taking the first mask layer 90 having the first mask pattern 100 as a mask, the epitaxial layer 50 is etched downwards through the etching process until the top surface of the substrate 10 is exposed, thus synchronously defining a forming position of the pattern region 60, a forming position of the contact region 70, and a forming position of the first electrode 20, as shown in FIG. 7.

In this embodiment, the forming position of the pattern region, the forming position of the contact region, and the forming position of the first electrode can be synchronously defined by using the first mask pattern on the first mask layer, thereby effectively reducing the process difficulty of the capacitor and saving the manufacturing cost of the capacitor.

Still referring to FIG. 12 and FIG. 13, after the forming position of the first electrode 20 is determined, and a gap 80 is formed in the pattern region 60, a groove 61 is formed in the pattern region 60. Thereafter, referring to FIG. 14 and FIG. 15, a first electrode material 110 is deposited in the groove 61 of the pattern region 60, and the first electrode material 110 fills up the groove 61 of the pattern region 60 and the gap 80. The first electrode material 110 extends outside the pattern region 60 and covers the top surface of the epitaxial layer 50 in the contact region 70. The first electrode material 110 may include, but is not limited to, polysilicon, metal tungsten, or titanium nitride, etc.

Thereafter, referring to FIG. 16 and FIG. 17, a portion of the first electrode material 110 in the groove 61 and a portion of the first electrode material 110 covering the top surface of the epitaxial layer 50 in the contact region 70 are removed by a self-alignment process and a maskless etching process; and a remaining portion of the first electrode material 110 in the gap 80 forms the first electrode 20.

In this embodiment, the first electrode material fills the groove and the gap and further covers the top surface of the contact region. Thereafter, the first electrode material in the groove and on the top surface of the contact region is removed by maskless etching. The first electrode material retained in the gap forms the first electrode. The first electrode is realized by a self-alignment process technology, which can avoid position deviation, ensure accurate removal of the first electrode material in the groove and on the top surface of the contact region, and improve the performance and reliability of the capacitor.

Figure 14:
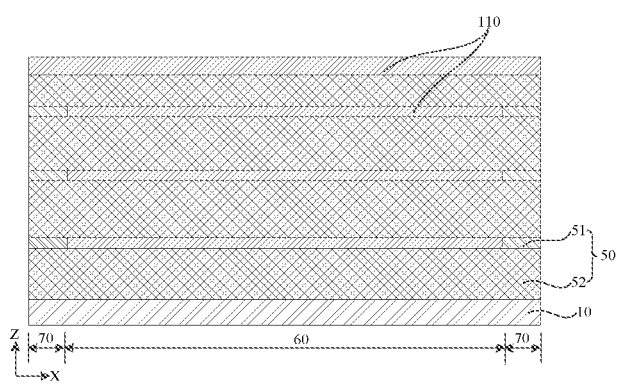
FIG. 14 is a sectional view of an A-A cross section of a first electrode material in FIG. 4 that is formed in a method of manufacturing a capacitor according to one exemplary embodiment.
Figure 15:
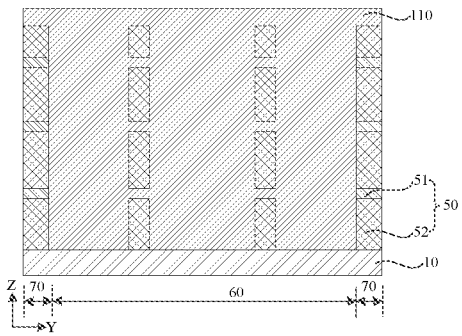
FIG. 15 is a sectional view of a B-B cross section of a first electrode material in FIG. 4 that is formed in a method of manufacturing a capacitor according to one exemplary embodiment.

In some embodiments, as shown in FIG. 14 to FIG. 17, the first electrode 20 may be formed in the gap 80 by the following method:

First, referring to FIG. 14 and FIG. 15, a first conductive material 110 is deposited in the groove 61 by using the deposition process. The first electrode material 110 fills up the gap 80 between the groove 61 and the remaining portion of the silicon-containing material layer 52 in the pattern region 60. The first electrode material 110 extends outside the groove 61 and covers the top surface of the epitaxial layer 50 located in the contact region 70.

The first electrode material 110 may be formed by using both an atomic layer deposition process and a chemical vapor deposition process.

In one example, one layer of the first electrode material 110 is first deposited on the surface of the groove 61 and the surface of the gap 80 by using the atomic layer deposition process, for example, the first electrode material 110 is continuously deposited by using the chemical vapor deposition process, such that the first electrode material fills up the groove 61 and the gap 80. Of course, in some embodiments, the first electrode material 110 may be deposited on the surface of the groove 61 and the surface of the gap 80 through the atomic layer deposition process until the gap 80 is filled up, and then the remaining portion is filled up by using the chemical vapor deposition process. In the embodiments of the present disclosure, a longer and more uniform and contact first electrode 20 can be formed by using the atomic layer deposition process and the chemical vapor deposition process, thereby effectively adapting to a high aspect ratio of the first electrode 20.

In another example, the first electrode material 110 is deposited at the top of the groove 61 to a predetermined height by using the atomic layer deposition process, and the predetermined height may be the top surface of a first layer of silicon-containing material layer 52 in the groove 61 in a direction from bottom to top. Thereafter, the first electrode material 110 is continuously deposited in the remaining portion of the groove 61 by using the chemical vapor deposition process; next, the first electrode material 110 is continuously deposited by using the atomic layer deposition process; and then, the atomic layer deposition process and the chemical vapor deposition process are alternately used until the first electrode material 110 covers the top surface of the epitaxial layer 50 located in the contact region 70.

The atomic layer deposition process has characteristics of slow deposition rate, high density of deposited film layers, and good step coverage. The first electrode material 110 formed by using the atomic layer deposition process can cover the bottom of the groove 61 or the gap 80 in a smaller space to avoid such problems as holes, thereby effectively ensuring the forming quality of the first electrode material 110, and improving the performance and yield of the first electrode 20.

Referring to FIG. 16 and FIG. 17, after the first electrode material 110 is formed, a portion of the first electrode material 110 in the groove 61 and a portion of the first electrode material 110 on the top surface of the epitaxial layer 50 positioned in the contact region 70 are removed by the self-alignment process and the maskless etching process; and a remaining portion of the first electrode material 110 in the gap 80 forms the first electrode 20.

In this embodiment, the first electrode material is formed by using both the atomic layer deposition process and the chemical vapor deposition process, such that the forming quality of the first electrode material is ensured, and the aspect ratio of the first electrode can also be effectively increased, thereby promoting the storage capacity and integration level of the capacitor.

In some embodiments, as shown in FIG. 18 to FIG. 26, after the first electrode 20 is formed in the gap 80, the method of manufacturing a capacitor further includes: forming a support structure 120 on a side wall of the first electrode 20.

Figure 19:
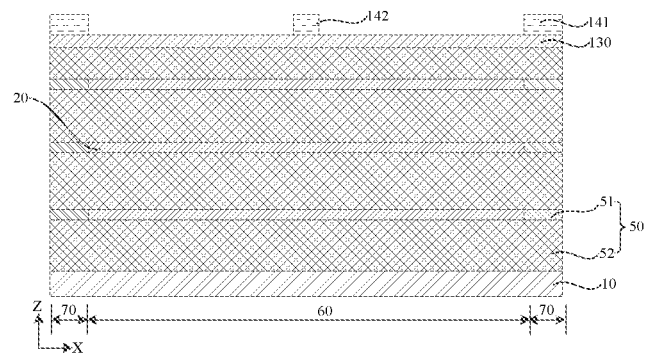
FIG. 19 is a sectional view of an A-A cross section of a support material in FIG. 4 that is formed in a method of manufacturing a capacitor according to one exemplary embodiment.
Figure 20:
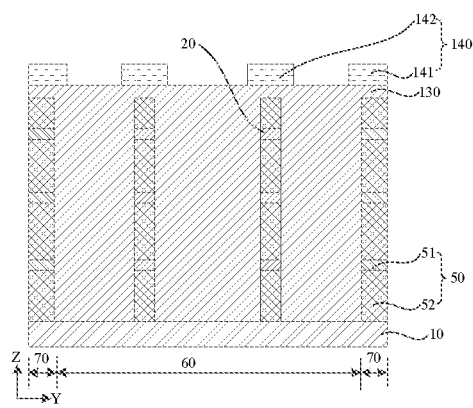
FIG. 20 is a sectional view of a B-B cross section of a support material and a second mask layer in FIG. 4 that are formed in a method of manufacturing a capacitor according to one exemplary embodiment.

The support structure 120 may be formed by using the following method:

Referring to FIG. 19 and FIG. 20, a support material 130 is deposited in the groove 61 of the pattern region 60 by using the deposition process, and the support material 130 extends outside the groove 61 and covers the top surface of the contact region 70. It should be noted that in the step of forming the first electrode 20, a groove formed in the pattern region 60 after the first electrode material 110 is removed is consistent with the groove 61 formed in the previous step in structure.

Figure 18:
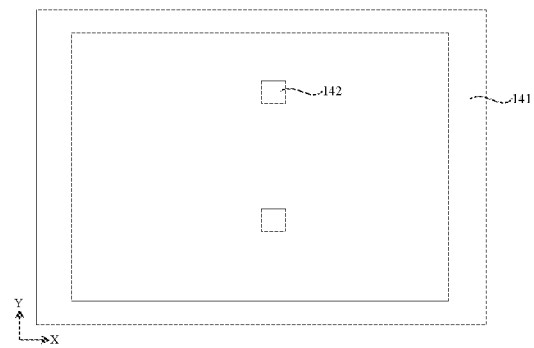
FIG. 18 is a top view of a second mask pattern formed in a method of manufacturing a capacitor according to one exemplary embodiment.

Thereafter, referring to FIG. 18 and FIG. 19, a patterned second mask layer 140 is formed on the surface of the support material 130 by using the deposition process. An edge of the patterned second mask layer 140 also covers the surface of the support material 130 in the contact region 70. Moreover, the patterned second mask layer 140 also forms array arrangement in the pattern region 60. The patterned second mask layer 140 forms a second mask pattern 141 on the support material 130, which is opened in middle and closed at an edge position; and a plurality of mask pillars 142 arranged in an array are formed in the pattern region 60. A projection area of the second mask pattern 141 on the substrate 10 is greater than a projection area of the contact region 70 on the substrate 10. An outer edge of the second mask pattern 141 is flush with an outer edge of the contact region 70, to form the support material 130 on the side wall of the retained epitaxial layer 50 in the contact region 70 for subsequently forming a support structure 120 (referring to FIG. 25). In the second direction Y, at least the same number of mask pillars 142 as the number of rows of first electrodes 20 are arranged for supporting the first electrodes 20 in each row. For example, in the embodiments referring to FIG. 1, FIG. 6, and FIG. 17, two rows of first electrodes 20 are arranged in the second direction Y; and at this time, two corresponding mask pillars 142 may be arranged directly above the first electrodes 20. In the second direction Y, a projection width of the mask pillars 142 on the substrate 10 is greater than a width of the first electrodes 20, thereby facilitating subsequent formation of support structures 120 on both sides of the first electrodes 20, and improving structural stability of a plurality of first electrodes 20 arranged in the vertical direction.

Figure 21:
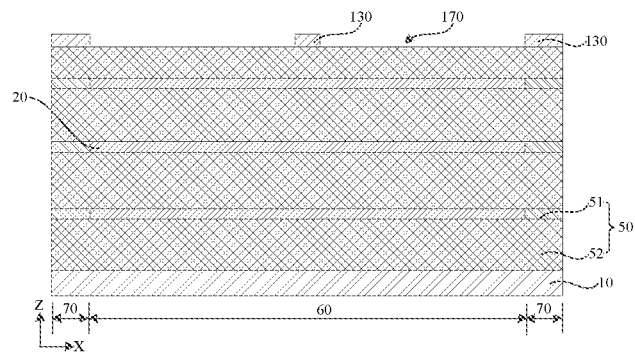
FIG. 21 is a sectional view of an A-A cross section in FIG. 4 after a portion of a support material is removed in a method of manufacturing a capacitor according to one exemplary embodiment.

Then, referring to FIG. 21, the support material 130 is etched downwards by taking the patterned second mask layer 140 as a mask until the epitaxial layer 50 is exposed, to form an array opening 170 in the pattern region 60.

Figure 22:
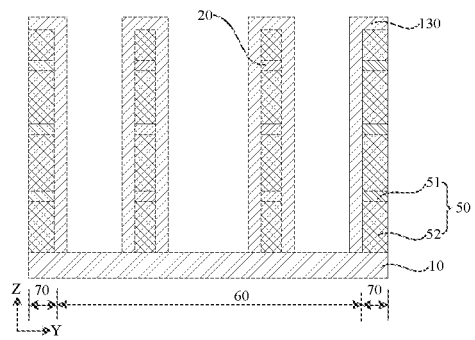
FIG. 22 is a sectional view of a B-B cross section in FIG. 4 after a portion of a support material is removed in a method of manufacturing a capacitor according to one exemplary embodiment.

As shown in FIG. 22, the support material 130 is continuously etched downwards along the array opening 170 until the top surface of the substrate 10 is exposed.

Figure 23:
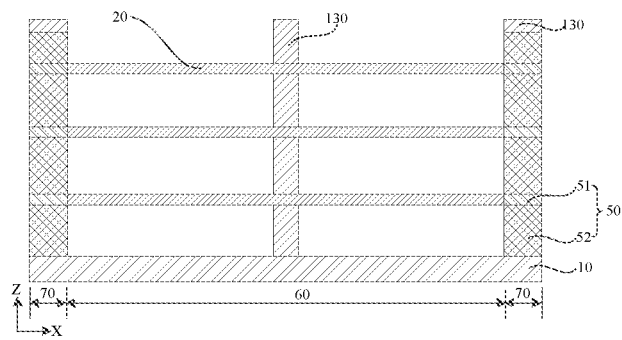
FIG. 23 is a sectional view of an A-A cross section in FIG. 4 after a silicon-containing material layer in a pattern region is removed in a method of manufacturing a capacitor according to one exemplary embodiment.
Figure 24:
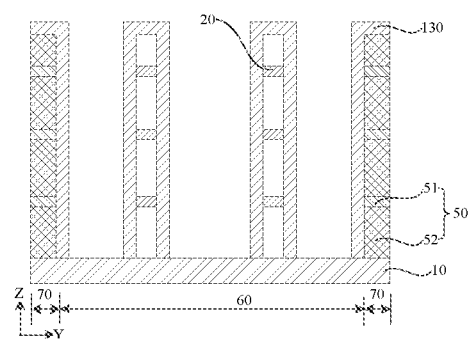
FIG. 24 is a sectional view of a B-B cross section in FIG. 4 after a silicon-containing material layer in a pattern region is removed in a method of manufacturing a capacitor according to one exemplary embodiment.

Referring to FIG. 23 and FIG. 24, after the top surface of the substrate 10 is exposed, a portion of the silicon-containing material layer 52 in the remaining portion of the epitaxial layer 50 is removed in the pattern region 60 by using a wet etching process. The wet etching process cannot damage the first electrode 20 and the remaining portion of the support material 130 when thoroughly removing the remaining portion of the silicon-containing material layer 52, thereby ensuring the performance of the capacitor.

Or, after the top surface of the substrate 10 is exposed, a portion of the silicon-containing material layer 52 in the remaining portion of the epitaxial layer 50 is removed in the pattern region 60 by using a steam etching process. In the steam etching process, etching steam may use HCl steam, with an etching time of 5-60 seconds, thereby quickly removing the silicon-containing material layer 52.

Figure 25:
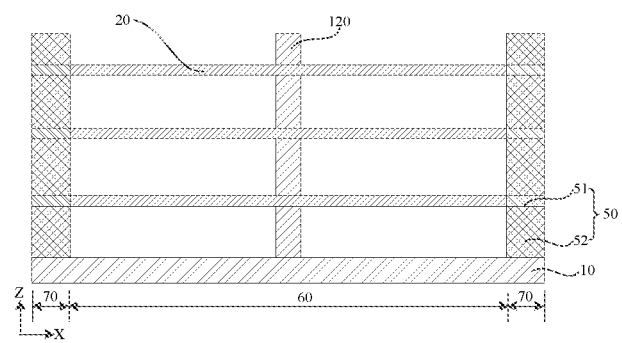
FIG. 25 is a sectional view of an A-A cross section of a support structure in FIG. 4 that is formed after a portion of a support material of a top surface height is removed in a method of manufacturing a capacitor according to one exemplary embodiment.
Figure 26:
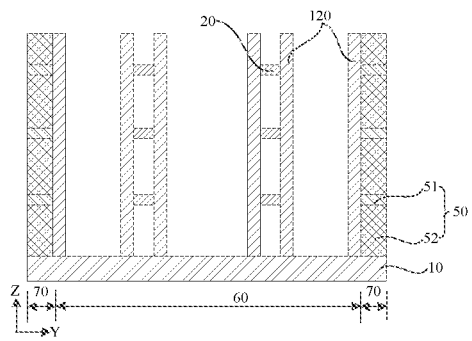
FIG. 26 is a sectional view of a B-B cross section of a support structure in FIG. 4 that is formed after a portion of a support material of a top surface height is removed in a method of manufacturing a capacitor according to one exemplary embodiment.

Finally, referring to FIG. 25 and FIG. 26, a portion of the support material 130 of a top surface height is removed by using the etching process to expose the top surface of the contact region 70, and the top of a portion of the support material 130 on both sides of the first electrode 20 is open, such that a remaining portion of the support material 130 on the side wall of the first electrode 20 and on the side wall of the contact region 70 forms the support structure 120.

After the remaining portion of the silicon-containing material layer 52 is removed, and the support structure 120 is formed, multiple layers of first electrodes 20 form a 3D space.

In this embodiment, the support structure is configured to support and protect the side walls of a plurality of first electrodes 20 located in the same column (i.e., arranged in the same vertical direction), such that more first electrodes can be arranged in the vertical direction, the possibility of expanding the capacitor in the vertical direction is increased, and the integration level of the capacitor per unit space area is effectively improved.

Figure 27:
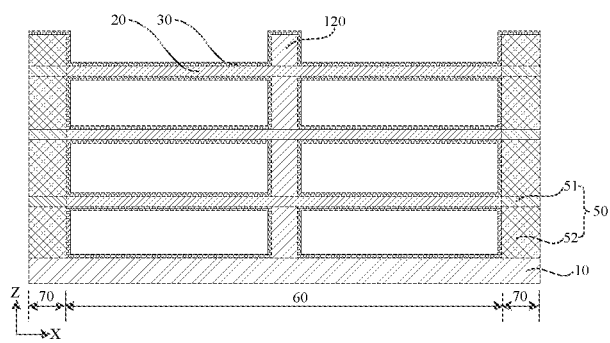
FIG. 27 is a sectional view of an A-A cross section of a dielectric layer in FIG. 4 that is formed in a method of manufacturing a capacitor according to one exemplary embodiment.
Figure 28:
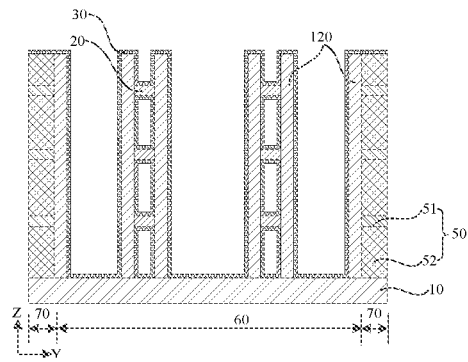
FIG. 28 is a sectional view of a B-B cross section of a dielectric layer in FIG. 4 that is formed in a method of manufacturing a capacitor according to one exemplary embodiment.

According to one exemplary embodiment, as shown in FIG. 27 and FIG. 28, this embodiment further describes step S300 described above.

A dielectric layer 30 is formed by using the atomic layer deposition process. The formed dielectric layer 30 continuously wraps the outer surface of the first electrode 20. When there is one first electrode 20, the dielectric layer 30 wraps the outer surface of the one of the first electrode 20, and also wraps the outer surface of the support structure 120. When there are a plurality of first electrodes 20 arranged in a rectangular array, the dielectric layer 30 continuously wraps the outer surfaces of the plurality of first electrodes 20 and the outer surface of the support structure 120, and forms a common dielectric layer 30.

In this embodiment, the dielectric layer is formed by using the atomic layer deposition process. The atomic layer deposition process has characteristics of slow deposition rate, high density of deposited film layers, and good step coverage. Forming the dielectric layer by using the atomic layer deposition process can cover the outer surface of the first electrode and the outer surface of the support structure in a smaller space to avoid occupying a large space, thereby effectively ensuring the forming quality of the dielectric layer, and improving the performance and yield of the capacitor.

Figure 29:
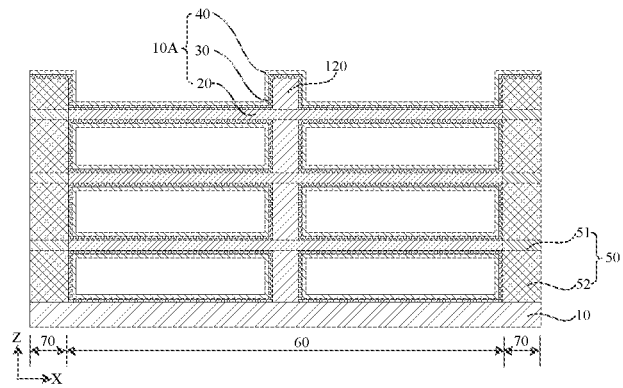
FIG. 29 is a sectional view of an A-A cross section of a second electrode in FIG. 4 that is formed in a method of manufacturing a capacitor according to one exemplary embodiment.
Figure 30:
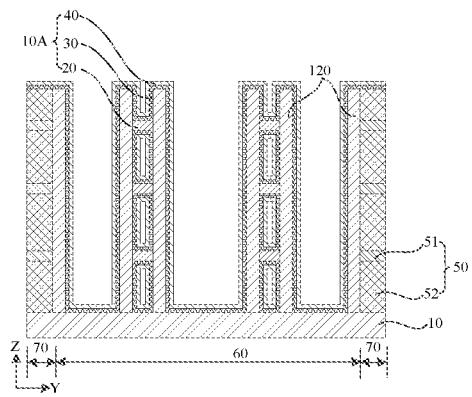
FIG. 30 is a sectional view of a B-B cross section of a second electrode in FIG. 4 that is formed in a method of manufacturing a capacitor according to one exemplary embodiment.

According to one exemplary embodiment, as shown in FIG. 29 and FIG. 30, this embodiment further describes step S400 described above.

A second electrode 40 is formed by using the atomic layer deposition process. The formed second electrode 40 continuously wraps the outer surface of the dielectric layer 30, and is shared by a plurality of horizontally arranged capacitors 10A.

In this embodiment, the second electrode is formed by using the atomic layer deposition process. The atomic layer deposition process has characteristics of slow deposition rate, high density of deposited film layers, and good step coverage. Forming the second electrode by using the atomic layer deposition process can cover the outer surface of the dielectric layer in a smaller space to avoid occupying a large space, thereby effectively ensuring the forming quality of the second electrode, and improving the performance and yield of the capacitor.

In some embodiments, referring to FIG. 27, the first electrode 20 in the capacitor 10A formed by using the method of manufacturing a capacitor has an aspect ratio between the first direction X and the third direction Z, and the preset aspect ratio is greater than or equal to 35. The first electrode 20 having an aspect ratio of greater than or equal to 35 may effectively increase the storage capacity of the horizontally arranged capacitor 10A. Moreover, in the second direction Y and the third direction Z, a plurality of first electrodes 20 arranged in a rectangular array may be arranged, and share one dielectric layer 30 and one second electrode 40, thereby effectively increasing the integration level of the capacitor while reducing the manufacturing process difficulty of the capacitor.

In some embodiments, as shown in FIG. 2 and FIG. 3, a memory structure including a horizontally arranged capacitor is shown, both with the schematic diagram of a support structure omitted. In this embodiment, the horizontally arranged capacitor is connected to a gate-all-around (GAA) transistor 150. The GAA transistor 150 is provided with a gate connected to a word line 151, a drain D connected to a bit line 152, and a source S connected to the first electrode 20 of the capacitor 10A. Or, the GAA transistor 150 is provided with a source S connected to a bit line 152 and a drain D connected to the first electrode 20 of the capacitor 10A. The first electrode 20 extends in the first direction X, the word line 151 extends in the second direction Y, and the bit line 152 extends in the third direction Z. In this embodiment of the present disclosure, the memory can further save the space on the basis of the structure of the capacitor 10A and the structure of the GAA transistor 150; and furthermore, when the 3D structure is formed, the space is expanded upward again, which is of great help to increase the integration level of the DRAM.

In this embodiment, referring to FIG. 2, two capacitors 10A located on the same horizontal line are oppositely arranged, are horizontally arranged, and are respectively connected to sources S or drains D of two oppositely arranged GAA transistors 150. The two GAA transistors 150 may share one bit line 152 and are located on the same horizontal line, to increase the integration level of the memory per unit area.

Referring to FIG. 3, two capacitors 10A located on the same horizontal line and horizontally arranged are oppositely arranged, and are respectively connected to sources S or drains D of two oppositely arranged GAA transistors 150. The two GAA transistors 150 share one bit line 152. In the second direction Y, a plurality of bit lines 152 are arranged at intervals, and are respectively connected to a plurality of columns of GAA transistors 150 arranged at intervals in one-to-one correspondence, such that a memory of a 3D structure may be formed, thereby increasing the possibility of expanding the capacitor in the vertical direction, and increasing the integration level of the capacitor per unit space area.

As shown in FIG. 2, one exemplary embodiment of the present disclosure provides a capacitor 10A, including a substrate 10, a first electrode 20, a dielectric layer 30, and a second electrode 40.

The first electrode 20 is arranged on the substrate 10, and the substrate 10 extends in the first direction X parallel to the substrate 10. The size of the first electrode 20 in the first direction X is greater than the size of the first electrode 20 in the second direction Y, and the first direction X is perpendicular to the second direction Y. The size of the first electrode 20 in the first direction X is also greater than the size of the first electrode 20 in the third direction Z, the first direction X is perpendicular to the third direction Z, and the second direction Y is also perpendicular to the third direction Z.

The dielectric layer 30 wraps the surface of the first electrode 20. The second electrode 40 wraps the surface of the dielectric layer 30.

In this embodiment, the first electrode, the dielectric layer, and the second electrode form a capacitor. The length size of the first electrode is greater than the width size and thickness size of the first electrode to form a horizontally placed capacitor, such that more capacitors may be arranged in a 3D space, thereby increasing the storage capacity of the memory.

In some embodiments, as shown in FIG. 3, the capacitor 10A is of a 3D structure, and the capacitor 10A of the 3D structure includes a plurality of first electrodes 20, a dielectric layer 30, and a second electrode 40.

The plurality of first electrodes 20 are arranged at intervals, and a 3D space is formed between adjacent two of the first electrodes 20. The plurality of first electrodes 20 may be arranged at intervals in the second direction Y. Or, the plurality of first electrodes 20 may be arranged at intervals in the third direction Z. Or, the plurality of first electrodes 20 are arranged at intervals in a rectangular array in the second direction Y and the third direction Z.

The dielectric layer 30 is located in the 3D space, and wraps the outer surfaces of the plurality of first electrodes 20 to form a plurality of dielectric layers 30 shared by the first electrodes 20.

The second electrode 40 is located in the 3D space, and wraps the outer surfaces of the plurality of dielectric layers 30 to form a plurality of second electrodes 40 shared by the first electrodes 20.

In this embodiment, the plurality of first electrodes are arranged in a rectangular array in the length direction, and share one dielectric layer and one second electrode, thereby forming a capacitor of a 3D structure. The capacitor of the 3D structure may be expanded in the second direction and third direction, such that more horizontally placed capacitors are arranged in a storage space per unit area, thereby effectively increasing the final integration level and storage capacity of the memory.

Figure 31:
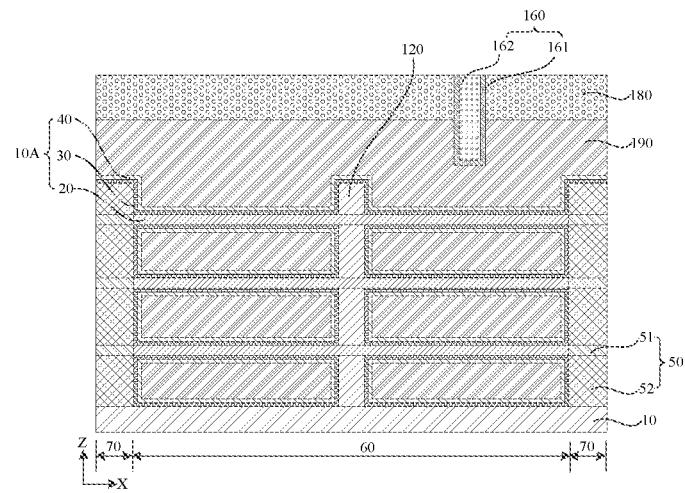
FIG. 31 is a sectional view of an A-A cross section of an external circuit in FIG. 4 that is formed in a method of manufacturing a capacitor according to one exemplary embodiment.
Figure 32:
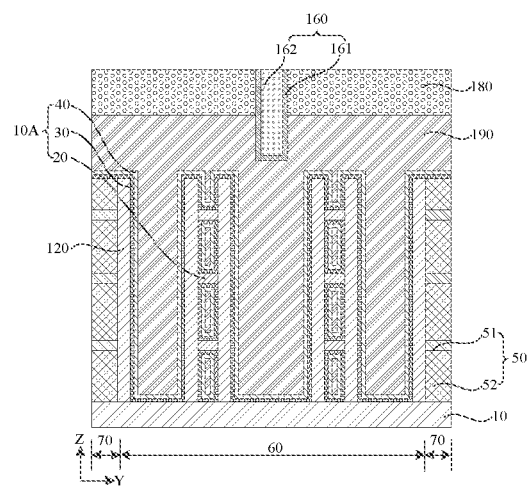
FIG. 32 is a sectional view of a B-B cross section of an external circuit in FIG. 4 that is formed in a method of manufacturing a capacitor according to one exemplary embodiment.

In some embodiments, as shown in FIG. 31 and FIG. 32, after the horizontally placed capacitor 10A is formed, a buffer layer 190 is formed on the surface of the second electrode 40 of the capacitor 10A, and a layer of isolation material 180 is provided on the buffer layer 190. The buffer layer 190 may be made of, but not limited to, polycrystalline silicon.

The capacitor 10A in this embodiment or the capacitor 10A of the 3D structure further includes an external circuit 160. The external circuit 160 is configured to electrically connect the capacitor 10A to a control circuit in a peripheral circuit region of the memory. The external circuit 160 includes a contact layer 161 and a conductive layer 162, and the contact layer 161 half wraps the conductive layer 162. The contact layer 161 is embedded in an isolation material 180, and the bottom of the contact layer 161 extends into a buffer layer 190 and is connected to the buffer layer 190. The contact layer 161 and the second electrode 40 are arranged at intervals.

As shown in FIG. 3, one exemplary embodiment of the present disclosure provides a memory. The memory includes the capacitor 10A and the GAA transistor 150 in the above embodiment. In this embodiment of the present disclosure, the memory can further save the space on the basis of the structure of the capacitor 10A and the structure of the GAA transistor 150; and furthermore, when the 3D structure is formed, the space is expanded upward again, which is of great help to increase the integration level of the DRAM.

The gate of the GAA transistor 150 is connected to the word line 151, one of the drain D and the source S of the GAA transistor 150 is connected to the bit line 152, and the other one of the drain D and the source S of the GAA transistor 150 is connected to the first electrode 20 of the capacitor 10A. The first electrode 20 extends in the first direction X, the word line 151 extends in the second direction Y, and the bit line 152 extends in the third direction Z.

In this embodiment, referring to FIG. 3, two oppositely arranged GAA transistors 150 horizontally arranged and located on the same horizontal line share one bit line 152, and the outer side of each GAA transistor 150 is connected to one horizontally arranged capacitor 10A. In the second direction Y, a plurality of word lines 151 are arranged at intervals, and are respectively connected to a plurality of columns of GAA transistors 150 arranged at intervals in one-to-one correspondence, such that a memory of a 3D structure is formed, thereby increasing the possibility of expanding the capacitor in the vertical direction, and increasing the integration level of the memory per unit space area.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the method of manufacturing a capacitor, the capacitor, and the memory provided by embodiments of the present disclosure, the first electrode extends in the first direction parallel to the substrate, and the transverse size of the first electrode is greater than the longitudinal size thereof, such that the first electrode, the dielectric layer, and the second electrode form a horizontally arranged capacitor, more capacitors may be arranged in the 3D space, and the storage capacity of the memory is increased.

The invention claimed is:

1. A method of manufacturing a capacitor, comprising:
providing a substrate;
forming a first electrode on the substrate, the first electrode extending in a first direction parallel to the substrate, a size of the first electrode in the first direction being greater than a size of the first electrode in a second direction and a size of the first electrode in a third direction, and every two of the first direction, the second direction, and the third direction being perpendicular to each other, wherein the forming the first electrode on the substrate comprises:
forming at least one epitaxial layer on the substrate, the epitaxial layer comprising a monocrystalline layer and a silicon-containing material layer arranged in a stacked manner, and a size of the monocrystalline layer in the first direction being greater than a size of the monocrystalline layer in the second direction and a size of the monocrystalline layer in the third direction;
defining a pattern region and a contact region on the epitaxial layer, wherein a portion of the monocrystalline layer in the contact region forms a source region or a drain region of a transistor;
selectively etching the epitaxial layer downwards in the pattern region until the substrate is exposed, a remaining portion of the epitaxial layer in the pattern region defining a position of the first electrode and extending transversely, wherein a remaining portion of the monocrystalline layer reserves a gap for the first electrode;
removing the remaining portion of the monocrystalline layer in the remaining portion of the epitaxial layer in the pattern region, and forming the gap; and forming the first electrode in the gap;
forming a dielectric layer wrapping the first electrode; and
forming a second electrode wrapping the dielectric layer.

2. The method of manufacturing a capacitor according to claim 1, further comprising:
forming a plurality of first electrodes arranged at intervals at least one of in the second direction or in the third direction, a three-dimensional space being formed between adjacent two of the first electrodes;
the dielectric layer wrapping surfaces of the plurality of first electrodes and being located in the three-dimensional space, and forming a common dielectric layer; and
the second electrode wrapping a surface of the dielectric layer and being located in the three-dimensional space, and forming a common second electrode.

3. The method of manufacturing a capacitor according to claim 1, wherein a patterned first mask layer is formed on the epitaxial layer, and the epitaxial layer is etched downwards by taking the patterned first mask layer as a mask until the substrate is exposed, to synchronously define the pattern region, the contact region, and the position of the first electrode.

4. The method of manufacturing a capacitor according to claim 1, wherein the forming the first electrode in the gap comprises:

depositing a first electrode material in the pattern region, the first electrode material filling up a groove in the pattern region and the gap, extending outside the pattern region, and covering a top surface of the contact region; and removing a portion of the first electrode material in the groove and on the top surface of the contact region by a maskless etching, a remaining portion of the first electrode material in the gap forming the first electrode.

5. The method of manufacturing a capacitor according to claim 4, wherein the first electrode material is formed by using both an atomic layer deposition process and a chemical vapor deposition process.

6. The method of manufacturing a capacitor according to claim 1, after the forming the first electrode in the gap, the method of manufacturing a capacitor further comprises: forming a support structure on a side wall of the first electrode; and the forming a support structure on a side wall of the first electrode comprises:

depositing a support material in the pattern region, the support material extending outside the pattern region and covering a top surface of the contact region;

forming a patterned second mask layer on a surface of the support material, the patterned second mask layer covering a surface of the contact region and further forming an array arrangement in the pattern region;

etching the support material downwards by taking the patterned second mask layer as a mask until the epitaxial layer is exposed, to form an array opening in the pattern region;

continuing etching the support material downwards along the array opening until the substrate is exposed; and removing a portion of the support material by a top surface height such that a remaining portion of the support material is located on the side wall of the first electrode and a side wall of the contact region, and forming the support structure.

7. The method of manufacturing a capacitor according to claim 1, when a plurality of first electrodes are formed, the method of manufacturing a capacitor further comprises:

removing a portion of the silicon-containing material layer in the remaining portion of the epitaxial layer in the pattern region by using a wet etching process or a steam etching process, to form a three-dimensional space.

8. The method of manufacturing a capacitor according to claim 1, wherein the forming a dielectric layer wrapping the first electrode comprises:

forming the dielectric layer by using an atomic layer deposition process, the dielectric layer continuously wrapping a surface of the first electrode.

9. The method of manufacturing a capacitor according to claim 1, wherein the forming a second electrode layer wrapping the dielectric layer comprises:

forming the second electrode layer by using an atomic layer deposition process, the second electrode layer continuously wrapping an outer surface of the dielectric layer.

10. The method of manufacturing a capacitor according to claim 1, wherein the first electrode has an aspect ratio between the first direction and the third direction, and the aspect ratio is greater than or equal to 35.

11. The method of manufacturing a capacitor according to claim 1, wherein the capacitor is connected to a gate-all-around transistor, a gate of the gate-all-around transistor is connected to a word line, one of a drain and a source of the gate-all-around transistor is connected to a bit line, the other one of the drain and the source of the gate-all-around transistor is connected to the first electrode of the capacitor, the first electrode extends in the first direction, the word line extends in the second direction, and the bit line extends in the third direction.

* * * * *